United States Patent [19]
Park et al.

[11] Patent Number: 5,999,463
[45] Date of Patent: Dec. 7, 1999

[54] REDUNDANCY FUSE BOX AND SEMICONDUCTOR DEVICE INCLUDING COLUMN REDUNDANCY FUSE BOX SHARED BY A PLURALITY OF MEMORY BLOCKS

[75] Inventors: Youn-sik Park; Gyu-hong Kim, both of Seoul, Rep. of Korea

[73] Assignee: Samsung Electronics Co., Ltd., Rep. of Korea

[21] Appl. No.: 09/056,426

[22] Filed: Apr. 7, 1998

[30] Foreign Application Priority Data

| Jul. 21, 1997 | [KR] | Rep. of Korea | 97-34008 |
| Aug. 5, 1997 | [KR] | Rep. of Korea | 97-37343 |

[51] Int. Cl.⁶ .................................................. G11C 7/00
[52] U.S. Cl. ..................... 365/200; 365/96; 365/230.06
[58] Field of Search ........................... 365/200, 230.06, 365/96, 225.7; 371/10.2

[56] References Cited

U.S. PATENT DOCUMENTS

| 4,758,993 | 7/1988 | Takemae | 365/222 |
| 4,829,480 | 5/1989 | Seo | 365/200 |
| 4,837,747 | 6/1989 | Dosaka et al. | 371/10.3 |
| 5,033,024 | 7/1991 | O'Connell et al. | 365/189.01 |
| 5,159,572 | 10/1992 | Morton | 365/230.06 |
| 5,193,076 | 3/1993 | Houston | 365/233.5 |
| 5,210,723 | 5/1993 | Bates et al. | 365/238.5 |
| 5,325,334 | 6/1994 | Roh et al. | 365/201 |
| 5,471,426 | 11/1995 | McClure | 365/200 |
| 5,610,865 | 3/1997 | Shin et al. | 365/200 |

*Primary Examiner*—Huan Hoang
*Assistant Examiner*—Hoai V. Ho
*Attorney, Agent, or Firm*—Myers Bigel Sibley & Sajovec

[57] ABSTRACT

A semiconductor device having a reduced number of column redundancy fuse boxes include a plurality of memory blocks having normal and redundant memory cells, a plurality of normal column selection line drivers, a plurality of redundant column selection line drivers, and a column redundancy fuse box. In particular, the normal and redundant column selection line drivers all include fuses. The column redundancy fuse box is connected in common to the plurality of redundant column selection line drivers. Also, the redundancy fuse box comprises a repair address determining portion for pre-latching a repair address and comparing input addresses with the latched repair address to determine whether the input address is the same as the repair address, and a redundancy enable signal generating portion for generating a redundancy enable signal in response to the output signals of the repair address determining portion.

14 Claims, 7 Drawing Sheets

REDUNDANCY FUSE BOX AND SEMICONDUCTOR DEVICE INCLUDING COLUMN REDUNDANCY FUSE BOX SHARED BY A PLURALITY OF MEMORY BLOCKS

FIELD OF THE INVENTION

The present invention relates to integrated circuit devices, and more particularly to integrated circuit memory devices having redundant memory cells, and methods of operating the same.

BACKGROUND OF THE INVENTION

Integrated circuit memory devices, including integrated circuits incorporating both memory and logic, often include a redundancy circuit to replace defective memory cells. The redundancy circuit generally includes redundancy memory cells and redundancy fuse boxes. The redundancy memory cells replace the defective memory cells. The redundancy fuse boxes recognize the addresses of the defective memory cells when they are input, and generate a redundancy enable signal for driving the redundancy memory cells.

Figure 1:
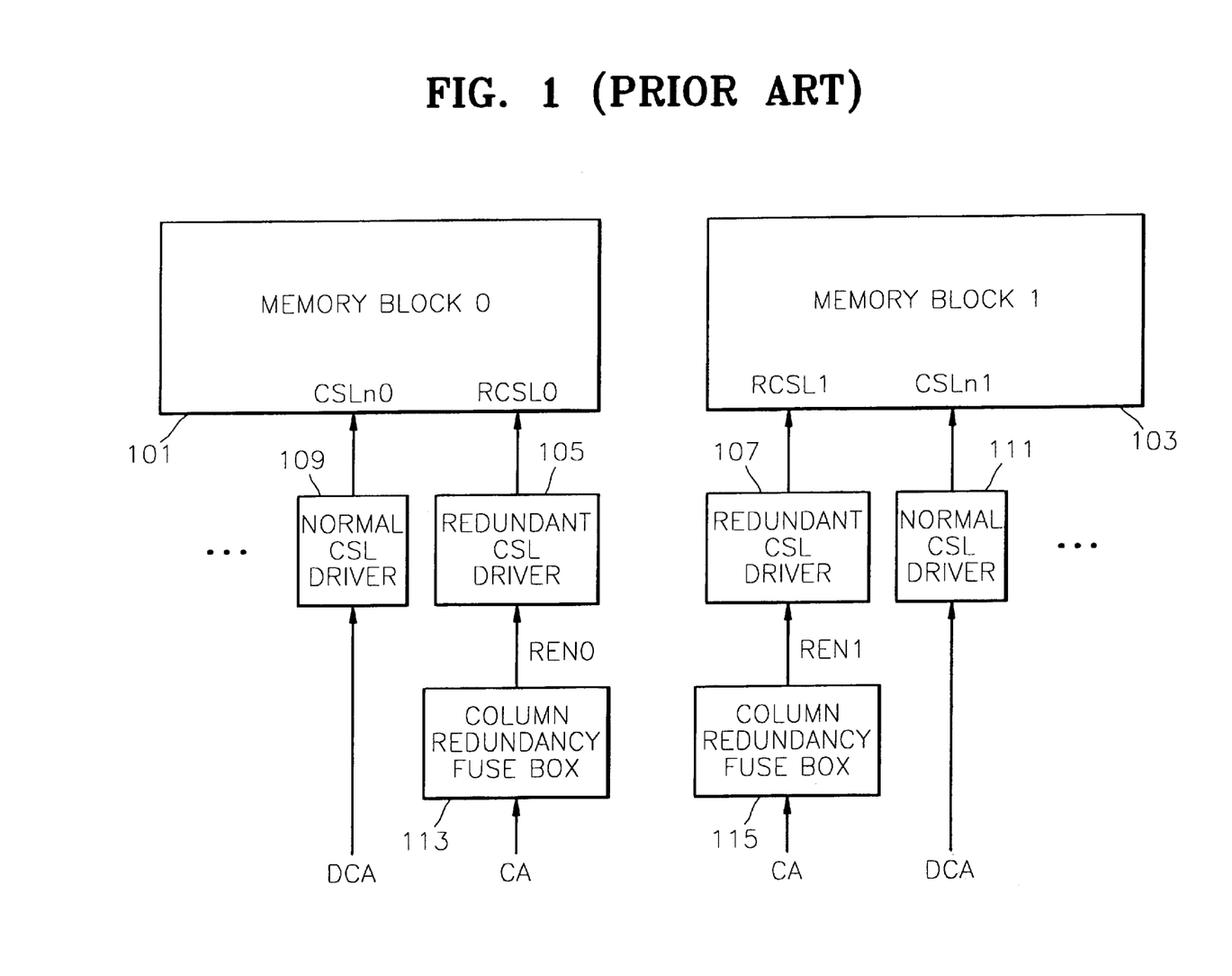
FIG. 1 is a block diagram of an integrated circuit device having a conventional column redundancy scheme.

FIG. 1 is a block diagram of a memory device having a conventional column redundancy scheme. For clarity, only blocks associated with column redundancy are shown.

Referring to FIG. 1, the device having a conventional column redundancy scheme includes a plurality of memory blocks 101 and 103 having memory cells, a plurality of normal column selection line drivers 109 and 111 for driving the respective column selection lines (CSLn0) and (CSLn1) of the memory blocks 101 and 103, a plurality of redundant column selection line drivers 105 and 107 for driving the respective redundant column selection lines (RCSL0) and (RCSL1) of the memory blocks 101 and 103, and a plurality of column redundancy fuse boxes 113 and 115 respectively connected to the redundant column selection line drivers 105 and 107.

The column redundancy fuse boxes 113 and 115 pre-store the addresses of defective memory cells when defective memory cells exist in the corresponding memory blocks 101 and 103. Accordingly, the respective column redundancy fuse boxes 113 and 115 activate the corresponding redundant column selection line drivers 105 and 107 in response to an input column address (CA).

Figure 2:
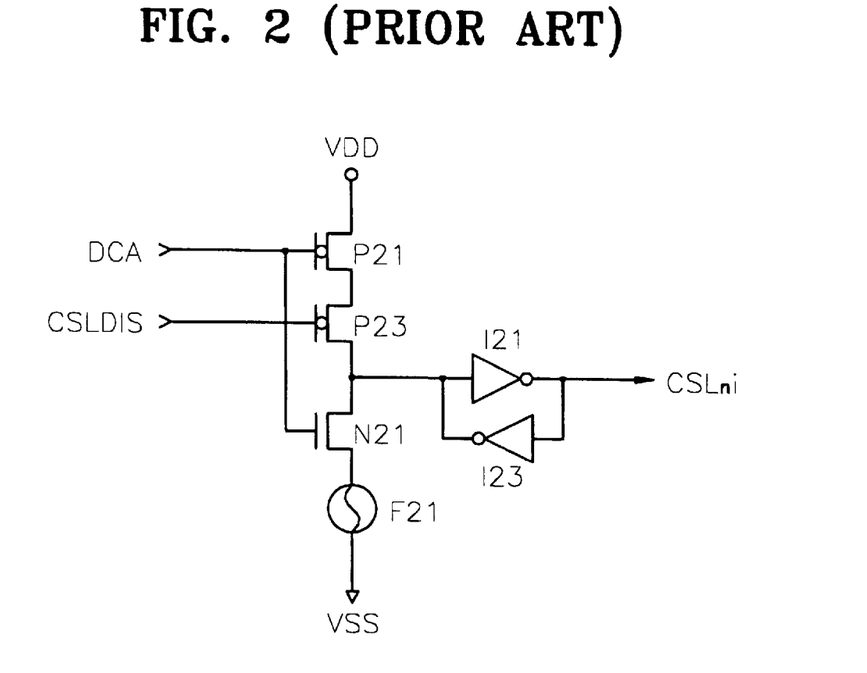
FIG. 2 is a circuit diagram of a normal column selection line driver shown in FIG. 1.
Figure 3:
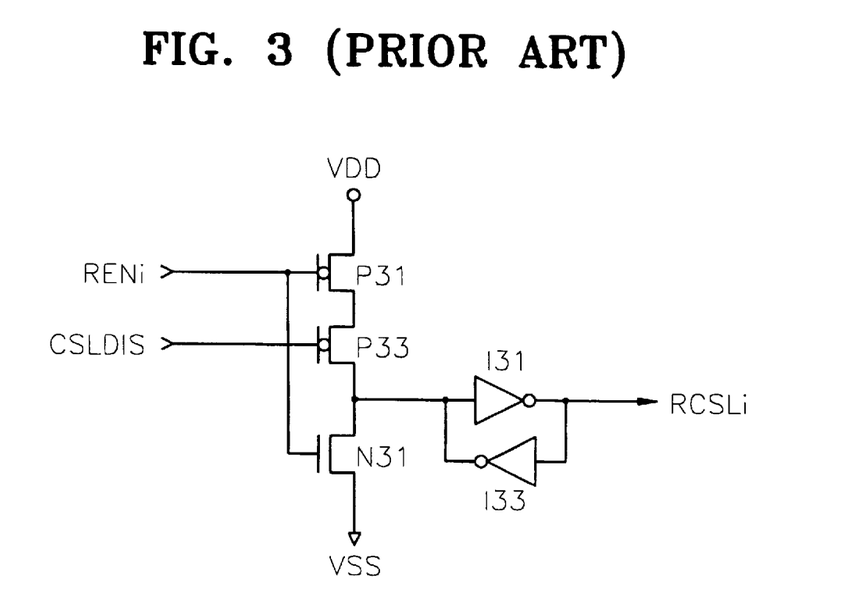
FIG. 3 is a circuit diagram of a redundant column selection line driver shown in FIG. 1.

FIG. 2 is a circuit diagram of the normal column selection line driver shown in FIG. 1. FIG. 3 is a circuit diagram of the redundant column selection line driver shown in FIG. 1. Referring to FIGS. 2 and 3, a fuse (F21) is included only in the normal column selection line driver.

In memory devices having the conventional column redundancy scheme, one column redundancy fuse box generally is allocated to one redundant column selection line, so that the devices generally include column redundancy fuse boxes corresponding to the number of redundant column selection lines. However, the column redundancy fuse box generally has a large layout area, and a fuse portion generally must be accessible to be cut by a laser. Therefore, when the number of fuse boxes increases, the area of the chip generally becomes larger.

SUMMARY OF THE INVENTION

It is an object of the present invention to provide memory devices and operating methods in which the number of redundancy fuse boxes can be reduced and redundancy can be effectively realized.

It is another object of the present invention to provide redundancy fuse boxes wherein a small number of fuses can be used and current consumption can be reduced.

It is still another object of the present invention to provide memory devices which include redundancy fuse boxes and can reduce current consumption during redundancy.

These and other objects are provided according to the present invention, by commonly storing addresses of defective memory cells of a plurality of memory blocks in a shared redundancy address storing unit, also referred herein as a column redundancy fuse box. Redundant selection line drivers such as redundant column selection line drivers, that are associated with the memory block having the defective memory cells are selectively activated, in response to receipt of an address of a defective memory cell by the shared redundancy address storage unit. A normal selection line driver that is associated with the memory block having defective memory cells is also selectively deactivated in response to receipt of an address of a defective memory cell by the shared redundancy address storing unit. Thus, the address of a defective row or column is commonly stored, and then the appropriate block driver is selectively activated or deactivated. The multibit address storage maybe commonly shared, and a single bit can be used to selectively activate or deactivate the appropriate blocks. Thus, the area of fuse boxes and the current consumption thereof can be reduced.

Integrated circuit memory devices according to the present invention include a plurality of memory blocks of normal and redundant memory cells, and a plurality of normal selection line drivers, a respective one of which is connected to a respective one of the memory blocks to address selected ones of the normal cells in the associated memory block. A plurality of redundant selection line drivers is also included, a respective one of which is connected to a respective one of the memory blocks, to address selected ones of the redundant memory cells in the associated memory block. A shared redundancy address storing unit commonly stores addresses of defective memory cells of the plurality of memory blocks. A circuit selectively activates a redundant selection line driver that is associated with the memory block having the defective memory cells, in response to receipt of an address of a defective memory cell by the shared redundancy address storing unit. A circuit also selectively deactivates a normal selection line driver that is assocaited with the memory block having the defective memory cells, in response to receipt of an address of a defective memory cell by the shared redundancy address storing unit.

It will be understood that the present invention may be used with redundant rows, redundant columns or both. Accordingly, when the word "column" is used herein, it merely refers to one direction in a block of memory cells rather than a specific direction.

More specifically, memory devices according to the invention comprise a plurality of memory blocks, a plurality of normal column selection line drivers, a plurality of redundant column selection line drivers, and a column redundancy fuse box which is connected in common to the redundant column selection line drivers.

The memory blocks have normal and redundant memory cells. The normal column selection line drivers are connected to corresponding memory blocks among the memory blocks, respectively, and drive the column selection lines of the corresponding memory blocks. The redundant column selection line drivers are connected to corresponding memory blocks among the memory blocks, respectively, and drive the redundant column selection lines of the corresponding memory blocks. In particular, the column redundancy fuse box is connected in common to the redundant column selection line drivers, pre-stores a repair column address, and activates the redundant column selection line drivers in response to input column addresses.

The normal and redundant column selection line drivers include fuses. Alternatively, the normal column selection line drivers include fuses, and the redundant column selection line drivers need not include fuses. The repair column address is a column address with respect to a defective memory cell among the normal memory cells.

Redundancy fuse boxes for memory devices comprising a repair address determining portion and a redundancy enable signal generating portion.

The repair address determining portion pre-latches a repair address and compares input addresses with the latched repair address to determine whether the input address is the same as the repair address. The redundancy enable signal generating portion is connected to the repair address determining portion, and generates a redundancy enable signal in response to the output signals of the repair address determining portion. The repair address is an address for a defective memory cell among memory cells. When the input address is identical to the repair address, the redundancy enable signal is activated.

The repair address determining portion comprises: a latch for latching the repair address; a comparator for comparing the output signal of the latch with the input address to generate the output signals of the repair address discriminating portion; and a controller for controlling the latch. The redundancy enable signal generating portion comprises: a discharge portion for discharging an output node in response to the output signal of the repair address determining portion and a control signal; a precharge portion for precharging the output node in response to the control signal; a controlling portion for receiving a column address strobe signal and a clock signal and generating the control signal; and a buffer portion for buffering a signal output by the output node and generating the redundancy enable signal.

Integrated circuit devices having a redundancy repair structure comprise a repair address determining portion, a redundancy enable signal generating portion, an address input buffer, and an address breaking portion.

The repair address determining portion latches a repair address beforehand, and compares input addresses with the latched repair address to determine whether the input address is the same as the repair address. The redundancy enable signal generating portion is connected to the repair address determining portion, and generates a redundancy enable signal in response to the output signals of the repair address determining portion. The address input buffer buffers the input addresses and transmits the buffered addresses to the inside of a chip. The address breaking portion is connected between the redundancy enable signal generating portion and the address input buffer, and prevents the input address from being transmitted to the address input buffer when the input address is identical to the repair address.

The repair address is an address for a defective memory cell among memory cells. When the input address is identical to the repair address, the redundancy enable signal is activated.

The repair address determining portion comprises: a latch for latching the repair address; a comparator for comparing the output signal of the latch with the input address to generate the output signals of the repair address discriminating portion; and a controller for controlling the latch. The redundancy enable signal generating portion comprises: a discharge portion for discharging an output node in response to the output signal of the repair address determining portion and a control signal; a precharge portion for precharging the output node in response to the control signal; a controlling portion for receiving a column address strobe signal and a clock signal and generating the control signal; and a buffer portion for buffering a signal output by the output node and generating the redundancy enable signal. The address breaking portion comprises transmission gates for transmitting the input addresses to the address input buffer in response to the redundancy enable signal. The address breaking portion prevents the input addresses from being transmitted to the address input buffer when the redundancy enable signal is activated.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 4:
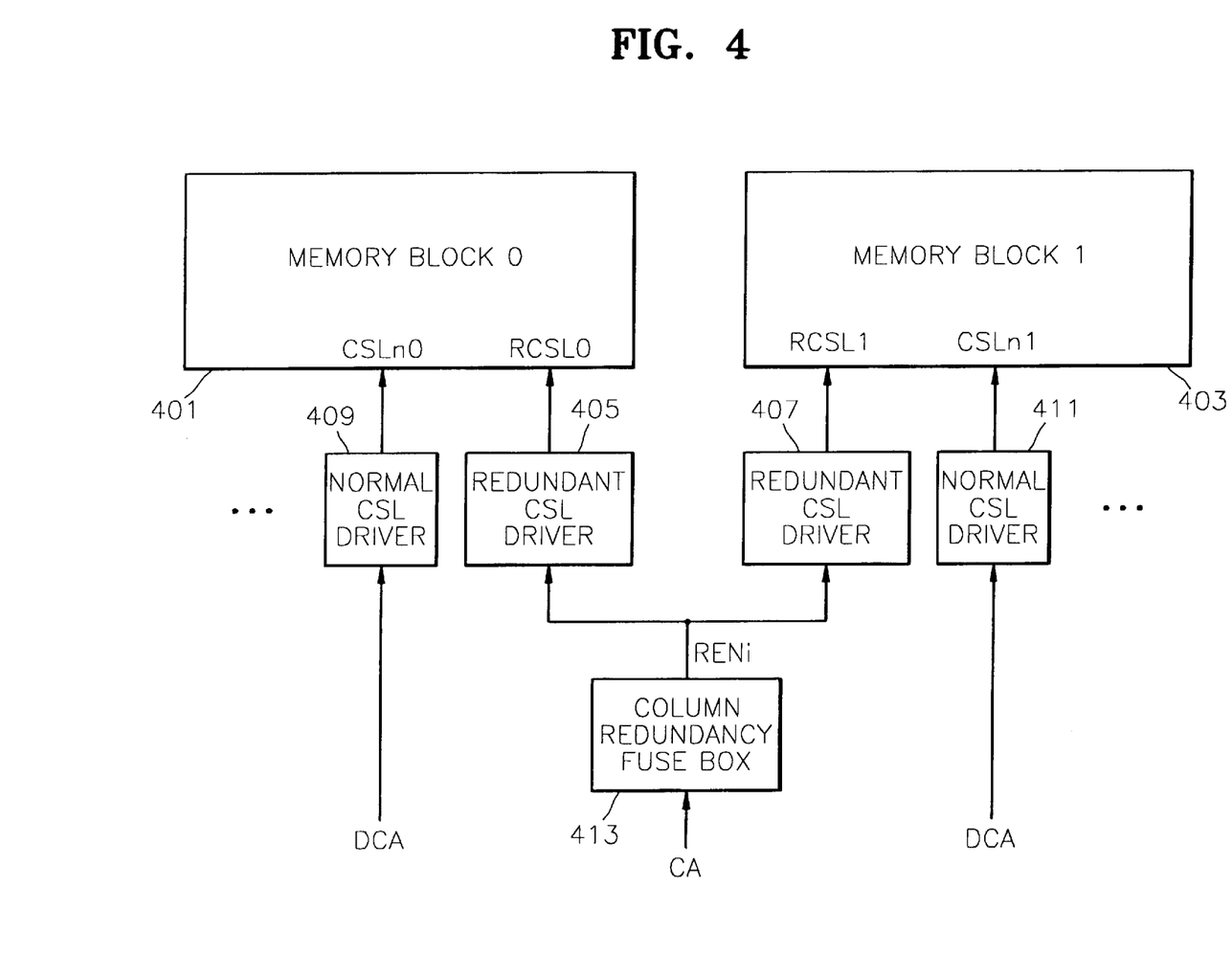
FIG. 4 is a block diagram of integrated circuit devices having a column redundancy scheme according to an embodiment of the present invention.

Referring to FIG. 4, an integrated circuit device such as a semiconductor device having a column redundancy scheme according to an embodiment of the present invention includes a plurality of memory blocks 401 and 403, a plurality of normal column selection line drivers 409 and 411, a plurality of redundant column selection line drivers 405 and 407, and a column redundancy fuse box 413 connected in common to the redundant column selection line drivers.

The memory blocks 401 and 403 include normal memory cells and redundant memory cells. The normal column selection line drivers 409 and 411 drive column selection lines (CSLn0) and (CSLn1) of the memory blocks in response to an address information signal, i.e., a decoded column address pulse (DCA), respectively. The redundant column selection line drivers 405 and 407 drive redundant column selection lines (RCSL0) and (RCSL1) of the memory blocks in response to a redundancy enable signal (RENi), respectively. In particular, the column redundancy fuse box 413 is connected in common to the plurality of redundant column selection line drivers 405 and 407, and activates the redundant enable signal (RENi) as an output signal in response to an input column address (CA). That is, when the redundant enable signal (RENi) is activated, the redundant column selection line drivers 405 and 407 start their operations.

If a defective memory cell exists in at least one of the memory blocks 401 and 403, a repair column address (or a defective column address) is pre-stored in the shared column redundancy fuse box 413. The repair column address is a column address with respect to a defective memory cell among the normal memory cells. The normal column selection line drivers 409 and 411 and the redundant column selection line drivers 405 and 407 all include a fuse. Alternatively, only the normal column selection line drivers 409 and 411 can include the fuse as needed. The detailed description of operation will be given later.

Figure 5:
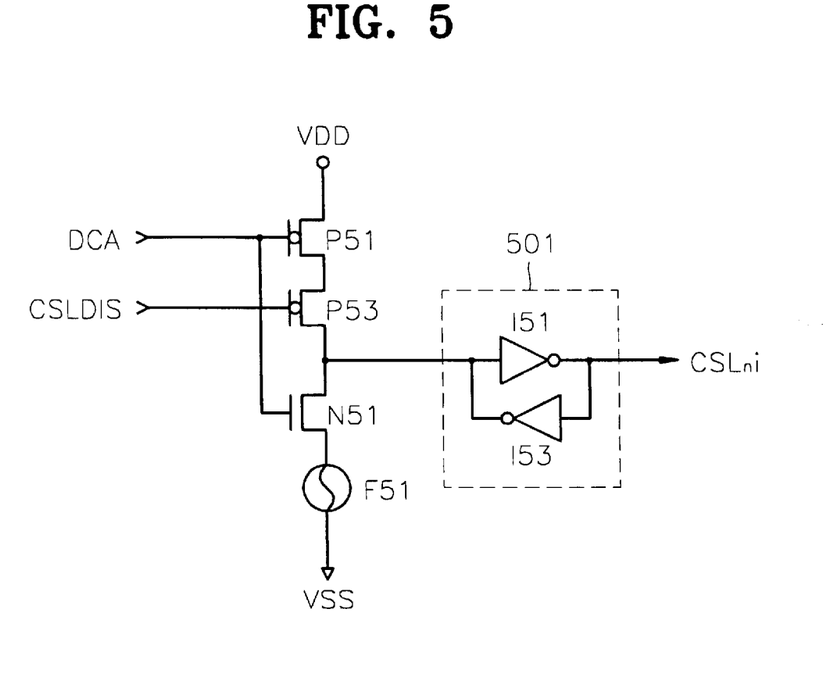
FIG. 5 is a circuit diagram of a normal column selection line driver shown in FIG. 4.

FIG. 5 is a circuit diagram of the normal column selection line driver shown in FIG. 4.

Referring to FIG. 5, the normal column selection line driver is comprised of a first PMOS transistor P51, a second PMOS transistor P53, an NMOS transistor N51, a fuse F51 and a latch 501. The first PMOS transistor P51 has a source to which power supply voltage (VDD) is applied, and a gate to which the decoded column address pulse (DCA) is applied. The second PMOS transistor P53 has a source to which the drain of the first PMOS transistor P51 is connected, and a gate to which a column selection line disable signal (CSLDIS) is applied. The NMOS transistor N51 has a drain to which the drain of the second PMOS transistor P53 is connected, and a gate to which the decoded column address pulse (DCA) is applied. The fuse F51 has one end contacting the source of the NMOS transistor N51 and the other end contacting a ground voltage VSS. The latch 501 latches signals output from the commonly-connected drains of the second PMOS transistor P53 and the NMOS transistor N51 and transmits the same to the column selection line (CSLni, I=0,1, . . . ).

The latch 501 is comprised of an inverter I51 whose input is connected in common to the drains of the second PMOS transistor P53 and the NMOS transistor N51, and output is connected to the column selection line (CSLni, I=0,1, . . . ), and an inverter I53 whose input is connected to the output of the inverter I51 and output is connected to the input of the inverter I51.

Figure 6:
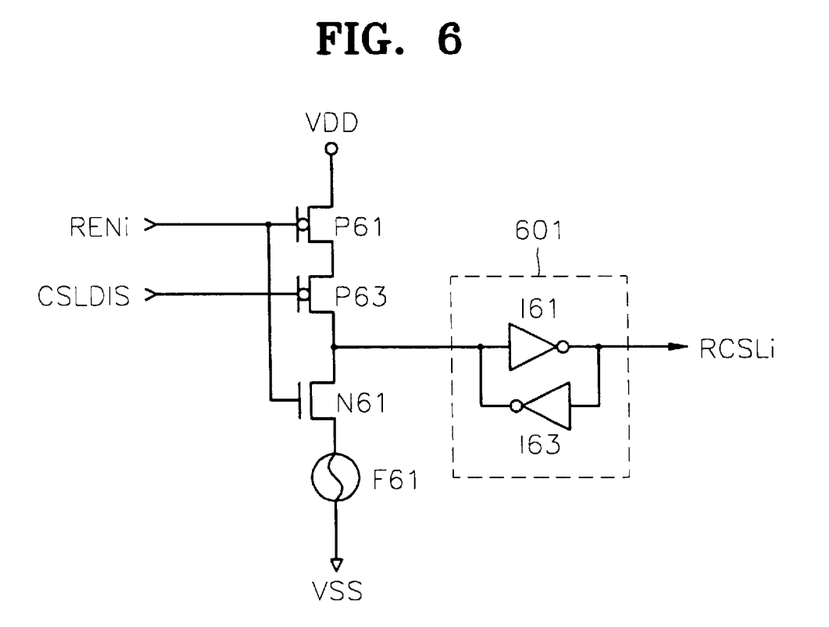
FIG. 6 is a circuit diagram of a redundant column selection line driver shown in FIG. 4.

FIG. 6 is a circuit diagram of the redundant column selection line driver shown in FIG. 4.

Referring to FIG. 6, the redundant column selection line driver is comprised of a first PMOS transistor P61, a second PMOS transistor P63, an NMOS transistor N61, a fuse F61 and a latch 601. The first PMOS transistor P61 has a source to which power supply voltage (VDD) is applied, and a gate to which the redundancy enable signal (RENi) is applied. The second PMOS transistor P63 has a source to which the drain of the first PMOS transistor P61 is connected, and a gate to which the column selection line disable signal (CSLDIS) is applied. The NMOS transistor N61 has a drain to which the drain of the second PMOS transistor P63 is connected, and a gate to which the redundancy enable signal (RENi) is applied. The fuse F61 has one end contacting the source of the NMOS transistor N61 and the other end contacting a ground voltage VSS. The latch 601 latches signals output from the commonly-connected drains of the second PMOS transistor P63 and the NMOS transistor N61 and transmits the same to the redundant column selection line (RCSLi, I=0,1, . . . ).

The latch 601 is comprised of an inverter I61 whose input is connected in common to the drains of the second PMOS transistor P63 and the NMOS transistor N61, and output is connected to the redundant column selection line (RCSLi, I=0,1, . . . ), and an inverter I63 whose input is connected to the output of the inverter I61 and output is connected to the input of the inverter I61. The redundant column selection line driver shown in FIG. 6 includes the fuse F61, but may not include the fuse as needed.

Figure 7:
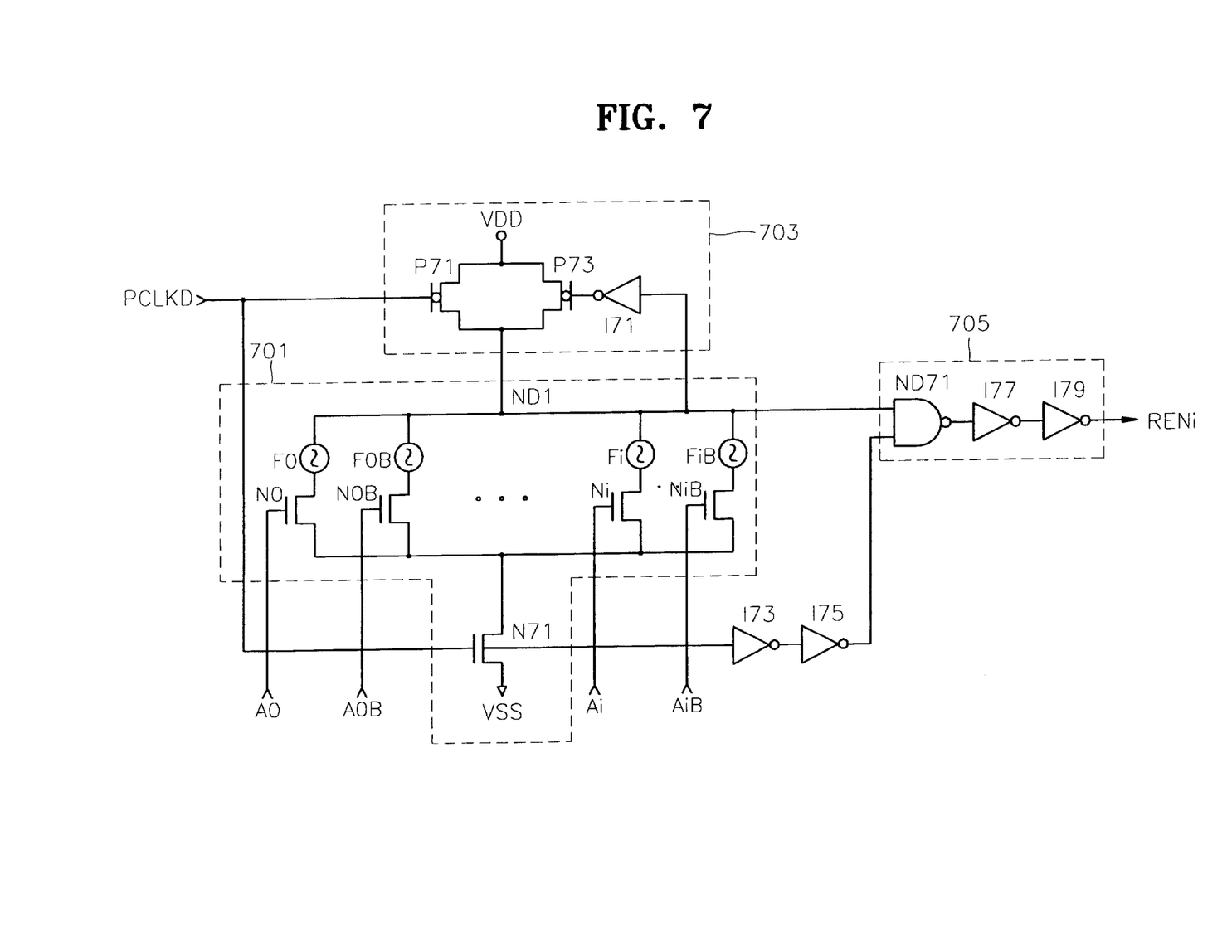
FIG. 7 is a circuit diagram of the column redundancy fuse box shown in FIG. 4.

FIG. 7 is a circuit diagram of the column redundancy fuse box shown in FIG. 4. Here, the column redundancy fuse box can be used as a row redundancy fuse box.

Referring to FIG. 7, the column redundancy fuse box includes a discharge portion 701, a precharge portion 703 and a buffer portion 705.

The discharge portion 701 discharges an output node ND1 in response to input addresses A0, A0B, A1, A1B, . . . , Ai, AiB. The input addresses A0, A0B, A1, A1B, . . . , Ai, AiB correspond to the column address CA in FIG. 4. The discharge portion 701 is an address storage block for storing a repair address (or a defective address) in advance to compare the input addresses A0, A0B, A1, A1B, . . . , Ai, AiB with the pre-stored repair address. The repair address denotes the address of a defective memory cell. The A0, . . . , Ai denote the respective bits of the input addresses, and the A0B, . . . , AiB denote the respective bits of complementary addresses with respect to the input addresses. The precharge portion 703 precharges the output node ND1 in response to a control signal (PCLKD). The buffer portion 705 inversely buffers a signal output from the output node ND1 after the control signal (PCLKD) responds to a signal buffered by the two inverters I73 and I75, and generates a redundancy enable signal (RENi).

The discharge portion 701 includes a plurality of fuses (F0, F0B, . . . , Fi, FiB) whose each end is connected to the output node ND1; a plurality of NMOS transistors (N0, N0B, . . . , Ni, NiB) having drains to which the other ends of the fuses are respectively connected, and gates to which bits (A0, A0B, . . . , Ai, AiB) of the input addresses are respectively connected; and an NMOS transistor N71 having a drain connected to the sources of the NMOS transistors (N0, N0B, . . . , Ni, NiB), a gate to which the control signal (PCLKD) is applied, and a source to which a ground voltage VSS is applied.

The precharge portion 703 includes a PMOS transistor P71 having a source to which a power supply voltage VDD is applied, a gate to which the control signal (PCLKD) is applied, and a drain connected to the output node ND1; an inverter I71 for inverting the voltage of the output node ND1; and a PMOS transistor P73 having a source to which the power supply voltage VDD is applied, a gate to which the output signal of the inverter I71 is applied, and a drain connected to the output node ND1.

The buffer portion 705 includes a NAND gate ND71 for receiving the output signals of the output node ND1 and the inverter I75; an inverter I77 for inverting the output signal of the NAND gate ND71; and an inverter I79 for inverting the output signal of the inverter I77 to generate the redundancy enable signal (RENi).

The operation of the semiconductor device having a column redundancy scheme according to the present invention will now be described referring to FIGS. 4 through 7. If there is a defective memory cell in at least one of the memory blocks 401 and 403, the column address of the defective memory cell is stored in the shared column redundancy fuse box 413, i.e., the column redundancy fuse box shown in FIG. 7. That is, a repair column address is stored in advance. For this, among the fuses (F0, F0B, . . . , Fi, FiB) in the column redundancy fuse box, fuses corresponding to the repair address are cut.

To be more specific, as a first example, if a defective memory cell exists in the column address of the memory block 401, e.g., A0 and a defective memory cell does not exist in the A0 of the memory block 403, the A0, i.e., a repair address is pre-stored in the shared column redundancy fuse box 413. Also, the fuse of the normal column selection line driver 409 corresponding to the defective memory cell of the memory block 401 is cut, and likewise for the fuse of the redundant column selection line driver 407 corresponding to the memory block 403. Accordingly, the normal and redundant column selection lines (CSLn0) and (RCSL1) respectively output by the normal and redundant column selection line drivers 409 and 407 are deactivated. Thus, when the column address CA that is the same as the repair address is input to the column redundancy fuse box 413, the redundancy enable signal (RENi) output from the column redundancy fuse box 413 is activated. Accordingly, only the redundant column selection line (RCSL0) output from the redundant column selection line driver 405 is activated. Therefore, the defective memory cell is replaced by the redundant memory cell.

As a second example, if a defective memory cell exists in both of the column addresses A0 of the memory blocks 401 and 403, the same column address A0 is pre-stored in the shared column redundancy fuse box 413. The fuses of the two normal column selection line drivers 409 and 411 corresponding to the respective defective memory cells of the two memory blocks 401 and 403 are all cut, but the fuses of the two redundant column selection line drivers 405 and 407 are not cut. Accordingly, the normal column selection lines CSLn0 and CSLn1 output by the two normal column selection line drivers 409 and 411 are all deactivated. Thus, when the column address CA that is the same as the repair address is input to the column redundancy fuse box 413, the redundancy enable signal (RENi) output from the column redundancy fuse box 413 is activated. Accordingly, the redundant column selection lines (RCSL0) and (RCSL1) output from the two redundant column selection line drivers 405 and 407 are all activated. Therefore, each of the defective memory cells of the two memory blocks 401 and 403 are replaced by the redundant memory cell simultaneously.

As a third example, if no defective memory cell exists in the column address of the memory block 401, e.g., A0 and a defective memory cell exists in the A0 of the memory block 403, an operation opposite to the first example is carried out. Thus, a detailed description of the opposite operation will be omitted.

As described above, all of the normal column selection line drivers 409 and 411 include the fuse, and the redundant column selection line drivers 405 and 407 may all not include the fuse. Accordingly, when a defective memory cell exists in one memory block of the two memory blocks 401 and 403, the redundant column selection line drivers are all activated. That is, since the two redundant column selection line drivers 405 and 407 both do not include a fuse, when a column address CA that is the same as the repair address is input to the column redundancy fuse box 413, the redundant column selection lines RCSL0 and RCSL1 output by the two redundant column selection line drivers 405 and 407 are all activated. Therefore, when a defective memory cell exists in both of the two memory blocks 401 and 403 or even if a defective memory cell exists in only one of the two memory blocks, it is replaced by a redundant memory cell simultaneously.

In memory devices having redundancy schemes according to the present invention, one redundancy fuse box may be shared by two or more memory blocks, so that the number of redundancy fuse boxes can be reduced by half or more compared to conventional technology. Thus, the area of the integrated circuit may be reduced, and redundancy is efficiently realized.

The redundancy fuse box shown in FIG. 7 is usually used in a semiconductor device, and uses two fuses for each bit of input addresses. Accordingly, as the number of bits of the input address increases, the number of total fuses increases, and the area of a chip is thus enlarged. Also, the redundancy fuse box consumes DC current during its operation, thus increasing the operating current of the entire chip. Therefore, according to the present invention, there is provided a redundancy fuse box which uses a small number of fuses and consumes a small amount of current.

Figure 8:
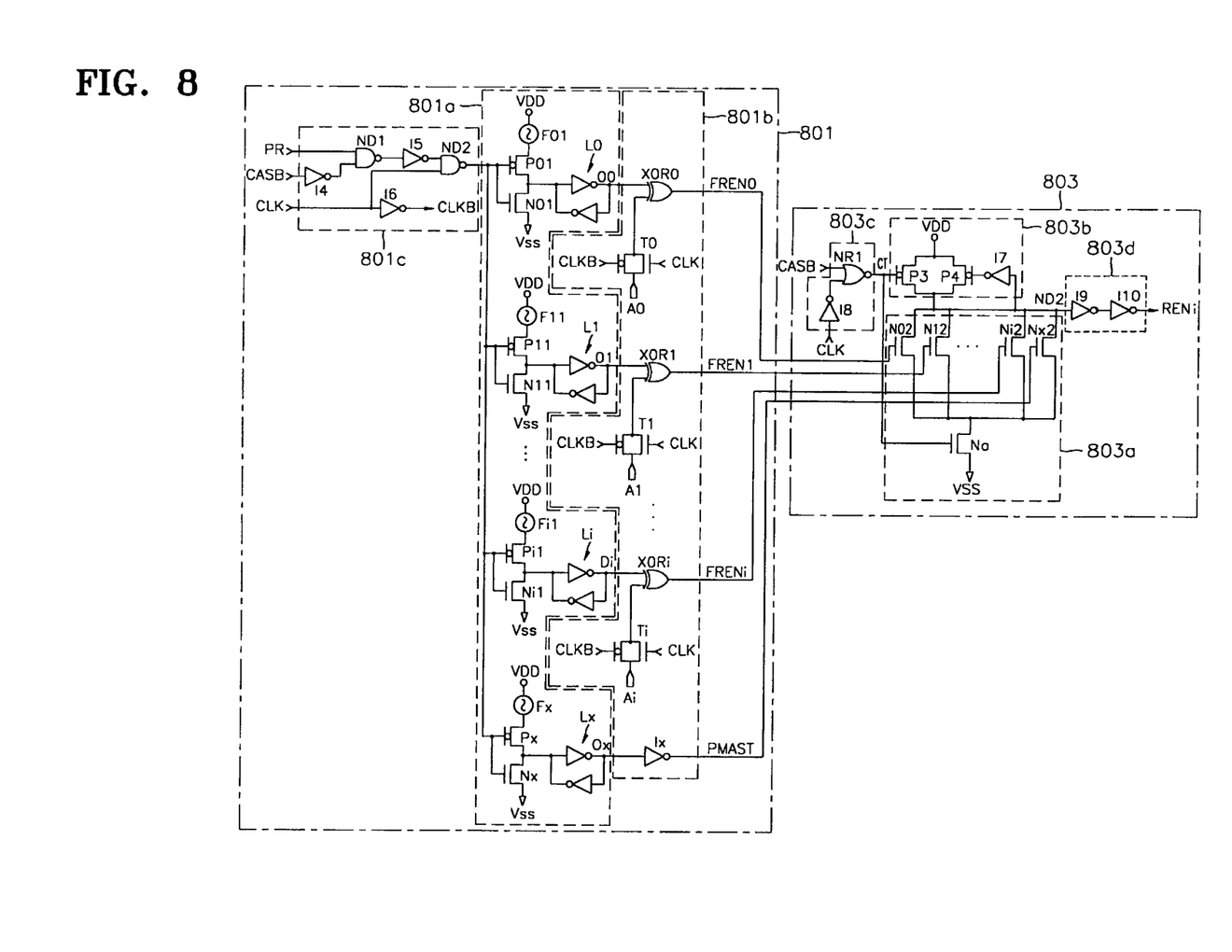
FIG. 8 is a circuit diagram of a redundancy fuse box according to an embodiment of the present invention.

FIG. 8 is a circuit diagram of the redundancy fuse box according to an embodiment of the present invention, which can be used as the column redundancy fuse box shown in FIG. 4.

Referring to FIG. 8, the redundancy fuse box is comprised of a repair address determining unit 801 and a redundancy enable signal generating unit 803.

The repair address determining unit 801 pre-stores and latches a repair address, and compares input addresses (A0, A1, . . . , Ai) with the latched repair address to determine whether the input addresses (A0, A1, . . . , Ai) are identical to the repair address. The redundancy enable signal generating unit 803 generates a redundancy enable signal (RENi) in response to the output signals (FREN0) to (FRENi) and (PMAST) of the repair address determining unit 801.

The repair address determining unit 801 includes a latch 801a for latching the repair address, a comparator 801b for comparing the output signals O0 to Oi of the latch 801a with the input addresses (A0, A1, . . . , Ai) to generate the output signals FREN0 to FRENi of the repair address determining unit, and a controller 801c for receiving a column address strobe signal CASB, a clock signal CLK and a control signal PR and controlling the latch 801a.

The latch 801a includes fuses F01 to Fi1 and Fx, in which one end of each is connected to a power supply voltage VDD, PMOS transistors P01 to Pi1 and Px having sources to which the other ends of the fuses P01 to Fi1 and Fx are connected and gates to which the output signal of the controller 801c is applied, NMOS transistors N01 to Ni1 and Nx having drains to which the drains of the PMOS transistors P01 to Pi1 and Px are connected, gates to which the output signal of the controller 801c is applied, and sources to which a ground voltage VSS is applied, and latches L0 to Li and Lx for latching signals output by the common drain of the PMOS transistors P01 to Pi1 and Px and the NMOS transistors N01 to Ni1 and Nx and outputting the latched signals as the output signals O0 to Oi and Ox of the latch. When a defective memory cell exists in a predetermined address, corresponding fuses among the fuses F01 to Fi1 are cut to store the predetermined address, i.e., a repair address. Also, the fuse Fx associated with the master signal (PMAST) is cut when a defective memory cell exists, and is not cut when a defective memory cell does not exist.

The comparator 801b includes transmission gates T0 to Ti, exclusive-OR gates XOR0 to XORi, and an inverter Ix. The transmission gates T0 to Ti transmit the respective bits of the input addresses (A0, A1, . . . , Ai) in response to the clock signal CLK. The exclusive-OR gates XOR0 to XoRi compare the respective bits of the input addresses (A0, A1, . . . , Ai) transmitted by the transmission gates T0 to Ti with the output signals O0 to Oi of the latch 801a, and generate the output signals FREN0 to FRENi. The inverter Ix inverts the output signal Ox of the latch 801a and generates the master signal PMAST.

The controller 801c includes an inverter I84 for inverting the column address strobe signal CASB, an AND gate ND1 and an inverter I85 where an AND operation is performed on the low address strobe chain master signal PR and the output signal of the inverter I84, and a NAND gate ND2 for NAND-gating the output signal of the inverter I85 and the clock signal CLK and generating a control signal for controlling the latch 801a.

The redundancy enable signal generating unit 803 is comprised of a discharge portion 803a, a precharge portion 803b, a controller 803c and a buffer 803d. The discharge portion 803a discharges the output node ND2 in response to the output signals FREN0 to FRENi and PMAST and the control signal CT. The precharging portion 803b precharges the output node ND2 in response to the control signal CT. The controller 803c receives the column address strobe signal CASB and the clock signal CLK and generates the control signal CT. The buffer 803d buffers a signal output by the output node ND2 to generate the redundancy enable signal RENi.

The discharge portion 803a includes NMOS transistors N02 to Ni2 and Nx2 having drains to which the output node ND2 is connected and gates to which the output signals FREN0 to FRENi and PMAST of the repair address determining portion are applied, and an NMOS transistor Na having a drain connected to the sources of the NMOS transistors N02 to Ni2 and Nx2, a gate to which the control signal CT is applied, and a source to which a ground voltage VSS is applied.

The precharging portion 803b includes a PMOS transistor P3, an inverter I87 and a PMOS transistor P4. The PMOS transistor P3 has a source to which a power supply voltage VDD is applied, a gate to which the control signal CT is applied, and a drain connected to the output node ND2. The inverter I87 inverts the voltage of the output node ND2. The PMOS transistor P4 has a source to which the power supply voltage VDD is applied, a gate to which the output signal of the inverter I87 is applied, and a drain connected to the output node ND2.

The controller 803c includes an inverter I88 for inverting the clock signal CLK, and a NOR gate NR1 for performing a NOR operation on the output signal of the inverter I88 and the column address strobe signal CASB to generate the control signal CT. The buffer 803d includes even numbers of inverters I89 and I80 which are connected in series.

Hereinafter, the operation of the redundancy fuse box according to the present invention shown in FIG. 8 will be described.

First, in order to latch a repair address to the latches L0 to Li and Lx of the latch 801a, only when each bit of the repair addresses is logic "high", corresponding fuses are precut. For instance, if the fuse F01 is not cut, the PMOS transistor P01 is turned on when the column address strobe signal CASB is logic "low" and the clock signal CLK is transmitted from logic "low" to logic "high". Thus, the output signal O0 of the latch L0 becomes logic "low". If the fuse F01 is cut, the NMOS transistor N01 is turned on by the clock signal CLK of logic "low", and the output signal O0 of the latch L0 returns to its previous state, i.e., logic "high". Then, the exclusive-OR gate (XOR0) compares the output signal O0 of the latch L0 with the input address bit A0 transmitted through the transmission gate T0 to generate the output signal FREN0. In the same manner as above, the values of the output signals O1 to Oi and Ox of the latches L1 to Li and Lx are determined depending on whether the remaining fuses F11 to Fi1 and Fx are cut or not. The exclusive OR gates XOR1 to XORi compare the output signals O1 to Oi with the input addresses A1 to Ai and generates output signals FREN1 to FRENi. Also, the inverter Ix inverts an output signal Ox and generates an output signal PMAST being a master signal.

If the input addresses (A0, A1, . . . , Ai) are the same as the repair address, i.e., if the input addresses (A0, A1, . . . , Ai) are the same as the output signals O0 to Oi of the latches L0 to Li, the output signals FREN0 to FRENi of the repair address determining unit 801 all become logic "low", and the master signal PMAST also becomes logic "low". Accordingly, the NMOS transistors N02 to Ni2 and Nx2 of the discharge portion 803a in the redundancy enable signal generating unit 803 are all turned on, so that the voltage level of the output node ND2 is not discharged to thus maintain the logic "high" state. The redundancy enable signal RENi becomes logic "high". Thus, the redundancy memory cells are accessed. That is, the redundancy memory cells instead of the defective memory cells are accessed and used.

On the other hand, if the input addresses (A0, A1, . . . , Ai) are not the same as the repair address, i.e., if the input addresses (A0, A1, . . . , Ai) are not the same as the output signals O0 to Oi of the latches L0 to Li, at least one of the output signals FREN0 to FRENi of the repair address determining unit 801 becomes logic "high". Accordingly, at least one of the NMOS transistors N02 to Ni2 and Nx2 of the discharge portion 803a is turned on. At this time, the NMOS transistor Na is turned on by the control signal CT, so that the voltage level of the output node ND2 is discharged to thus become logic "low". The redundancy enable signal RENi becomes logic "low". Thus, the redundancy memory cells are not accessed.

Figure 9:
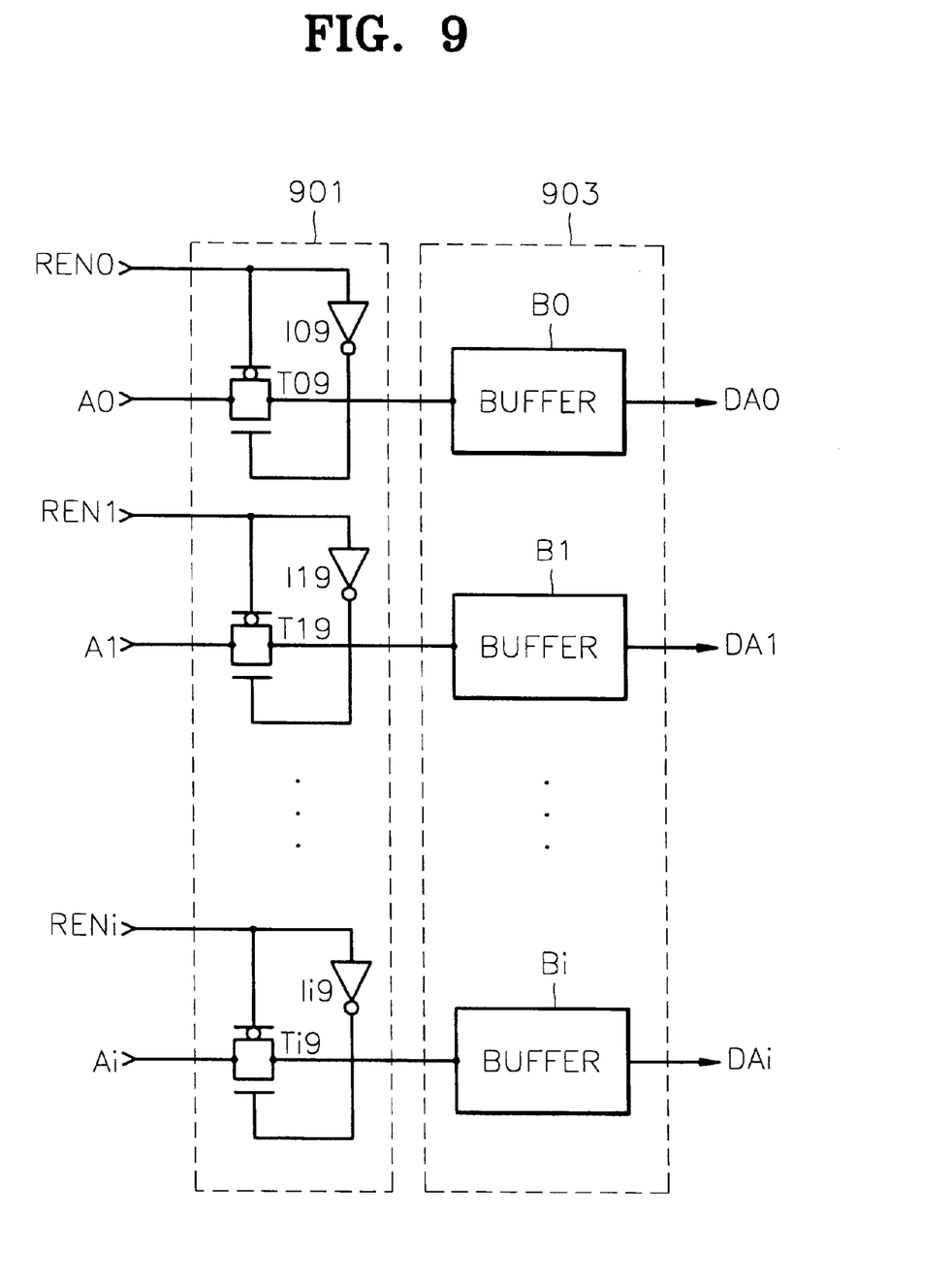
FIG. 9 is a circuit diagram including an address breaking portion of a device according to an embodiment of the present invention.

FIG. 9 is a circuit diagram including an address breaking portion for a semiconductor device according to an embodiment of the present invention.

Referring to FIG. 9, an address breaking portion 901 is connected to the input of an address input buffer 903. The address breaking portion 901 prevents the input addresses (A0, A1, . . . , Ai) from being transmitted to the address input buffer 903 when the input addresses (A0, A1, . . . , Ai) are the same as the repair address.

The address breaking portion 901 includes transmission gates T09 to Ti9 for transmitting the respective bits of the input addresses (A0, A1, . . . , Ai) to each of the buffers B0 to Bi of the address input buffer 903 in response to the redundancy enable signals REN0 to RENi. Accordingly, when the input addresses (A0, A1, . . . , Ai) are the same as the repair address, i.e., when the redundancy enable signals REN0 to RENi are activated to logic "high", the input addresses (A0, A1, . . . , Ai) are prevented from being transmitted to the address input buffer 903. Therefore, the operations of the address input buffer are temporarily paused, thus reducing current consumption of the semiconductor device.

In integrated circuit memory devices having redundancy schemes according to the present invention, one redundancy fuse box is shared by two or more memory blocks, so that the number of redundancy fuse boxes can be reduced by half or more compared to conventional technology. Accordingly, the area of the integrated circuit may be reduced. Also, in the redundancy fuse box according to the present invention, the number of fuses used can be reduced by half compared to conventional technology, so that the integrated circuit area can be reduced and current consumption can be decreased. Furthermore, in the semiconductor device including the address breaking portion according to the present invention, when input addresses are the same as a repair address, they are prevented from being transmitted to an address input buffer. Therefore, the operations of the address input buffer are temporarily stopped, thus reducing current consumption.

As described above, the present invention was described restrictedly by taking embodiments, but it is not limited to the embodiments. It is apparent that various variations may be effected by those skilled in the art within the scope of the appended claims.

What is claimed is:

1. A semiconductor memory device comprising:
    a plurality of memory blocks having normal and redundant memory cells;
    a plurality of normal column selection line drivers which are connected to corresponding memory blocks among said memory blocks, respectively, and drive the column selection lines of said corresponding memory blocks;
    a plurality of redundant column selection line drivers which are connected to corresponding memory blocks among said memory blocks, respectively, and drive the redundant column selection lines of said corresponding memory blocks; and
    a column redundancy fuse box which is connected in common to all of said redundant column selection line drivers, pre-stores a repair column address, and activates one of said redundant column selection line drivers in each of said memory blocks in response to input column addresses.

2. The semiconductor device according to claim 1, wherein all of said normal and redundant column selection line drivers include fuses.

3. The semiconductor device according to claim 1, wherein said normal column selection line drivers include fuses, and said redundant column selection line drivers do not include fuses.

4. The semiconductor device according to claim 1, wherein said repair column address is a column address with respect to a defective memory cell among said normal memory cells.

5. The semiconductor device according to claim 2, wherein said normal column selection line drivers each comprise:
    a first PMOS transistor having a source to which a power supply voltage is applied and a gate to which a decoded column address pulse is applied;
    a second PMOS transistor having a source to which the drain of said first PMOS transistor is connected and a gate to which a column selection line disable signal is applied;
    an NMOS transistor having a drain to which the drain of said second PMOS transistor is connected and a gate to which said decoded column address pulse is applied;
    a fuse whose one end is connected to the source of said NMOS transistor and whose other end is connected to a ground voltage; and
    a latch for latching a signal output by the commonly-connected drains of said second PMOS transistor and said NMOS transistor and transmitting the latched signal to said column selection line.

6. The semiconductor device according to claim 2, wherein said redundant column selection line drivers each comprise:
    a first PMOS transistor having a source to which a power supply voltage is applied and a gate to which a redundancy enable signal being the output of said fuse box is applied;
    a second PMOS transistor having a source to which the drain of said first PMOS transistor is connected and a gate to which a column selection line disable signal is applied;
    an NMOS transistor having a drain to which the drain of said second PMOS transistor is connected and a gate to which said redundancy enable signal is applied;
    a fuse whose one end is connected to the source of said NMOS transistor and whose other end is connected to a ground voltage; and
    a latch for latching a signal output by the commonly-connected drains of said second PMOS transistor and said NMOS transistor and transmitting the latched signal to said redundant column selection line.

7. The semiconductor device according to claim 3, wherein said normal column selection line drivers each comprise:
    a first PMOS transistor having a source to which a power supply voltage is applied and a gate to which a decoded column address pulse is applied;
    a second PMOS transistor having a source to which the drain of said first PMOS transistor is connected and a gate to which a column selection line disable signal is applied;
    an NMOS transistor having a drain to which the drain of said second PMOS transistor is connected and a gate to which said decoded column address pulse is applied;
    a fuse whose one end is connected to the source of said NMOS transistor and whose other end is connected to a ground voltage; and
    a latch for latching a signal output by the commonly-connected drains of said second PMOS transistor and said NMOS transistor and transmitting the resultant structure to said column selection line.

8. The semiconductor device according to claim 3, wherein said redundant column selection line drivers each comprise:
    a first PMOS transistor having a source to which a power supply voltage is applied and a gate to which a redundancy enable signal being the output of said fuse box is applied;
    a second PMOS transistor having a source to which the drain of said first PMOS transistor is connected and a gate to which a column selection line disable signal is applied;
    an NMOS transistor having a drain to which the drain of said second PMOS transistor is connected and a gate to which said redundancy enable signal is applied; and a latch for latching a signal output by the commonly-connected drains of said second PMOS transistor and said NMOS transistor and transmitting the latched signal to said redundant column selection line.

9. A method of operating an integrated circuit memory device having a plurality of memory blocks of normal and redundant memory cells, a plurality of normal selection line drivers, a respective one of which is connected to a respective one of the memory blocks to address selected ones of the normal memory cells in the associated memory block, and a plurality of redundant selection line drivers, a respective one of which is connected to a respective one of the memory blocks to address selected ones of the redundant memory cells in the associated memory block, the operating method comprising the steps of:

commonly storing addresses of defective memory cells of all the plurality of memory blocks in a shared redundancy address storing unit; and selectively activating a redundant selection line driver that is associated with the each of memory blocks, in response to receipt of an address of a defective memory cell in one of the memory blocks by the shared redundancy address storing unit.

10. A method according to claim 9 further comprising the step of:

selectively deactivating a normal selection line driver that is associated with the memory block having the defective memory cells, in response to receipt of an address of a defective memory cell by the shared redundancy address storing unit.

11. An integrated circuit memory device comprising:

a plurality of memory blocks of normal and redundant memory cells;

a plurality of normal selection line drivers, a respective one of which is connected to a respective one of the memory blocks to address selected ones of the normal memory cells in the associated memory block;

a plurality of redundant selection line drivers, a respective one of which is connected to a respective one of the memory blocks to address selected ones of the redundant memory cells in the associated memory block;

means for commonly storing addresses of defective memory cells of all the plurality of memory blocks; and means for selectively activating a redundant selection line driver that is associated with each of the memory blocks, in response to receipt of an address of a defective memory cell in one of the memory blocks by the means for commonly storing.

12. A memory device according to claim 11 further comprising:

means for selectively deactivating a normal selection line driver that is associated with the memory block having the defective memory cells, in response to receipt of an address of a defective memory cell by the means for commonly storing.

13. An integrated circuit memory device comprising:

a plurality of memory blocks of normal and redundant memory cells;

a plurality of normal selection line drivers, a respective one of which is connected to a respective one of the memory blocks to address selected ones of the normal memory cells in the associated memory block;

a plurality of redundant selection line drivers, a respective one of which is connected to a respective one of the memory blocks to address selected ones of the redundant memory cells in the associated memory block;

a shared redundancy address storing unit that commonly stores addresses of defective memory cells of all the plurality of memory blocks; and a circuit that selectively activates a redundant selection line driver that is associated with each of the memory blocks, in response to receipt of an address of a defective memory cell in one of the memory blocks by the shared redundancy address storing unit.

14. A memory device according to claim 13 further comprising:

a circuit that selectively deactivates a normal selection line driver that is associated with the memory block having the defective memory cells, in response to receipt of an address of a defective memory cell by the shared redundancy address storing unit.

* * * * *